US007884918B2

(12) United States Patent
Hattori

(10) Patent No.: US 7,884,918 B2
(45) Date of Patent: Feb. 8, 2011

(54) EXPOSURE APPARATUS AND METHOD OF MANUFACTURING DEVICE

(75) Inventor: Tadashi Hattori, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 107 days.

(21) Appl. No.: 12/469,118

(22) Filed: May 20, 2009

(65) Prior Publication Data

US 2009/0305176 A1 Dec. 10, 2009

(30) Foreign Application Priority Data

Jun. 9, 2008 (JP) ............................. 2008-150836

(51) Int. Cl.
G03B 27/68 (2006.01)
G03B 27/42 (2006.01)

(52) U.S. Cl. .......................................... 355/52; 355/53

(58) Field of Classification Search .................. 355/52, 355/53, 55, 67, 77; 250/548; 356/399–401, 356/500, 510
See application file for complete search history.

(56) References Cited

U.S. PATENT DOCUMENTS 6,400,445 B2 * 6/2002 Nishi et al. .................. 355/72
6,900,880 B2 * 5/2005 Kida et al. .................. 355/67
7,423,726 B2 * 9/2008 Kosugi ......................... 355/53
2003/0133125 A1 7/2003 Hattori ........................ 356/500

FOREIGN PATENT DOCUMENTS

JP 2001-15422 1/2001

OTHER PUBLICATIONS

English Translation of Japanese Patent Application Laid-Open No. 2001-15422.

* cited by examiner

Primary Examiner—Hung Henry Nguyen
(74) Attorney, Agent, or Firm—Fitzpatrick, Cella, Harper & Scinto

(57) ABSTRACT

An exposure apparatus includes a first measurement device, a second measurement device, and a controller. The first measurement device measures the position of a substrate stage in the optical axis direction when the substrate stage is scanned in the first direction. The second measurement device measures the surface positions of the substrate in the optical axis direction at a plurality of measurement points on one straight line extending in the second direction on the substrate. The controller controls the second measurement device to measure at least one identical region on the substrate at different measurement points of the plurality of measurement points both before and after the substrate stage moves in steps in the second direction, and calculates a measurement error of the first measurement device attributed to the driving of the substrate stage in the second direction based on the measurement result obtained by the second measurement device.

10 Claims, 10 Drawing Sheets

STAGE POSITION X=X0

STAGE POSITION X=X1

EXPOSURE APPARATUS AND METHOD OF MANUFACTURING DEVICE

BACKGROUND OF THE INVENTION

1. Field of the Invention

The present invention relates to an exposure apparatus and a method of manufacturing a device.

2. Description of the Related Art

The current mainstream semiconductor exposure apparatus is an exposure apparatus of the step & repeat scheme called a stepper. The stepper reduces, at a predetermined ratio, the information of light having passed through an original on which a pattern is drawn, and exposes a photosensitive agent applied on a substrate to light to transfer the pattern of the original onto the substrate, while the substrate is positioned to stand still at a predetermined position. The stepper repeats this series of exposure operations over the entire substrate surface by driving a substrate stage which holds the substrate step by step. A substrate, an original, and a photosensitive agent are commonly referred to as a wafer, a reticle, and a resist, respectively.

In contrast to a stepper which performs full-plate exposure in shots on the wafer while the wafer stands still, an exposure apparatus of the step & scan scheme called a scanner exposes a wider region while synchronously scanning the wafer and the reticle.

In general, it is necessary to perform the above-described series of exposure operations a number of times for the same wafer in manufacturing a semiconductor using an exposure apparatus. In other words, it is necessary to transfer by exposure a subsequent pattern to a shot, in which a previous pattern has already been formed, so that these patterns are accurately overlaid on each other. To meet this need, an array of shots must be measured in advance. A measurement mark can be inserted in each pattern in advance and measured using a scope. It is a common practice to use an off-axis scope (to be abbreviated as an OAS hereinafter) using non-exposure light for this measurement. Since an OAS uses non-exposure light, it can perform the measurement without exposing the resist to light, but must be arranged to be spaced apart from the projection optical system to prevent the light from entering it (see FIG. 6).

The scanner generally performs real-time focusing, i.e., performs focusing while driving the stage in exposing the wafer under the projection optical system. Focus sensors 6A and 6C are arranged in front and in the rear of an actual exposure position (slit), i.e., positions shifted from this exposure position in the Y direction, as shown in FIG. 6. When the wafer is exposed by scanning the stage from the lower side of the paper surface of FIG. 6, the Z position of the wafer surface is measured by the focus sensor 6C before exposure, and the stage is driven in the Z direction before the exposure position reaches the slit position. When the stage is scanned from the upper side of the paper surface of FIG. 6, the focus sensor 6A is used as in the focus sensor 6C. A focus sensor 6B is arranged at the slit position as well in order to confirm whether the wafer surface is focused on the lens image plane of the projection optical system. The tilt of the wafer surface in the slit can also be detected by juxtaposing a plurality of sensors in the X direction. In this manner, the focus is measured immediately before exposure. This obviates the need to measure the focus over the entire wafer surface, sustaining a high throughput.

An exposure sequence using an OAS is as follows. As a wafer is transported to the exposure apparatus, a given mark in each sample shot on the wafer is measured using the OAS. A positioning error (X, Y, and rotational components) of the wafer and an error attributed to thermal expansion of the wafer are calculated based on the measurement results. The wafer is moved under the lenses of the projection optical system, and each shot is exposed. Increasing the number of sample shots improves an overlay accuracy but decreases the throughput. Furthermore, forming a plurality of measurement marks in one shot and measuring them allows exposure compatible with the shot shape and further improves an overlay accuracy, but again decreases the throughput.

To improve both the throughput and the accuracy by simultaneously performing the measurement and exposure of each sample shot, there is a scheme which uses two wafer stages so that measurement is performed by an OAS on one stage while exposure is performed on the other stage (see FIG. 7). This scheme is commonly referred to as the twin-stage configuration, whereas a scheme which uses only one stage is commonly referred to as the single-stage configuration.

In the twin-stage configuration, as a wafer is loaded onto one wafer stage, X and Y displacements of a shot are measured by an OAS first. Next, focus sensors measure the entire wafer surface. At this time, the other wafer stage is present under the lenses of the projection optical system. The former wafer stage is moved under the lenses of the projection optical system while holding the measured wafer, and exposure is started on this stage. At this time, the latter wafer stage is driven to the OAS position, and wafer loading, OAS measurement, and focus measurement are performed on this stage parallel to exposure in the same way. As long as the OAS measurement and the focus measurement are complete until the exposure, the throughput never lowers even if the number of sample shots is increased. In this case, it is possible to simultaneously optimize the throughput and the accuracy.

Focus sensors are typically juxtaposed in the X direction. This is to shorten the measurement time by a width as wide as possible upon scanning the stage in the Y direction. In addition, laser interferometers (to be described later) are set respectively at the lens position and the OAS position.

The wafer stage is required to be driven to arbitrary positions in a two-dimensional plane (the X-Y plane) over a wide range with high accuracy. One reason is that along with advances in micropatterning of semiconductor circuits, the required accuracy is increasingly becoming stricter. Another reason is that the wafer stage must be driven over a very wide range in practice to handle situations such as an increase in the wafer size, when the wafer is driven to its exchange position, and when the marks formed on the wafer by exposure are measured at positions other than the exposure position.

A laser interferometer is commonly used to detect the position of the wafer stage. The position of the wafer stage in the X-Y plane can be measured by arranging such a laser interferometer in the X-Y plane. For example, a plane mirror 2A (to be referred to as a bar mirror hereinafter) for X-axis measurement can be mounted on a wafer stage 1 in the Y-axis direction, as shown in FIG. 1. A laser interferometer 3A-1 which measures the position of the wafer stage in the X-axis direction irradiates the bar mirror 2A with a laser beam nearly parallel to the X-axis to make reference light and the light reflected by the bar mirror 2A interfere with each other, thereby detecting the relative driving amount of the wafer stage. The same applies to measurement of the position of the wafer stage in the Y-axis direction. A rotation angle θz of the wafer stage about the Z-axis can also be detected by providing two interferometers for one or both of the X-axis and Y-axis measurements.

The wafer stage can be driven to a predetermined position by arranging an actuator (not shown) such as a linear motor in the X-Y plane based on the position information obtained by the laser interferometers.

As the NAs of lenses increase to keep up with advances in micropatterning of circuits, the error tolerance of focusing for transferring a reticle image onto a wafer narrows (the depth of focus decreases), so the required accuracy of positioning in the focus direction (Z direction) is becoming stricter. For this reason, the position of the stage in the Z direction (focus direction) perpendicular to the X-Y plane, and the tilts of the stage in the X- and Y-axis directions must also be measured and controlled with high accuracy. The tilt in the X-axis direction is a rotational component about the Y-axis, and is commonly referred to as θy. The tilt in the Y-axis direction is a rotational component about the X-axis and is commonly referred to as θx. Under the circumstances, a tilt measurement scheme has been proposed. In this scheme, two X-axis interferometers 3A-1 and 3A-2 are juxtaposed in the Z direction, and position measurements are performed by simultaneously using them, thereby measuring a tilt θy of the stage in the X direction from the difference between the obtained measurement data. Likewise, a tilt θx in the Y-axis direction can be measured by juxtaposing two Y-axis interferometers 3B-1 and 3B-2 in the Z direction (see FIG. 1).

A method of measuring the position of the wafer stage in the Z direction using a laser interferometer has also been proposed. FIG. 2 shows an example of the configuration of a Z laser interferometer for detecting the position of the wafer stage in the Z direction. Laser light is perpendicularly reflected upward by a reflecting mirror 4A mounted on the stage. A 45° reflecting mirror 4B is mounted on a lens base serving as a reference, and horizontally reflects the laser light. A 45° reflecting mirror 4C is set near the lens center of the projection optical system, and projects the laser light perpendicularly downward. A reflecting mirror 4D is arranged on the stage, and perpendicularly reflects the laser light which then traces back the way it came. A reflecting mirror 4A is provided on the stage, and laser light reflected by it moves in the X direction as the stage X position moves. Accordingly, bar mirrors extending in the X direction are prepared as 45° reflecting mirrors 4B and 4C. This makes it possible to always apply laser light at the same position on the stage even when the stage moves in the X direction. When the stage moves in the Y direction, the positions of both the reflecting mirror 4A and laser light reflected by it remain the same because the reflecting mirror 4A is mounted on the X stage. At this time, since the position of the laser light relative to the Y position of the stage moves, a bar mirror 4D extending in the Y direction is provided on the stage. This makes it possible to always apply laser light onto the mirror surface on the stage even when the stage moves in the Y direction. This, in turn, always allows measurement by a laser interferometer even when the stage moves in the X-Y plane.

The relative position between the stage and the lens base surface can also be measured by mounting a 45° bar mirror 4E extending in the Y direction on the stage, and installing a bar mirror 4F extending in the X direction on the lens base, in addition to the measurement equipments described above (see FIG. 3).

In both the configurations shown in FIGS. 2 and 3, similar configurations are applied at the left and right sides (to be referred to as the L and R sides, respectively, hereinafter). As long as the measurement equipments on the L and R sides can simultaneously measure the Z positions of the stage over the entire X-Y plane, it is possible to more precisely measure the final Z position of the stage using the average of the obtained measurement results. It is also possible to measure the tilt of the stage by measuring the difference between these measurement results.

When the stage is driven in the X direction, the stage positioning accuracy in the X direction is influenced by the flatnesses of the bar mirrors 4B, 4C, and 4F extending in the X direction. Likewise, when the stage is driven in the Y direction, the stage positioning accuracy in the Y direction is influenced by the flatnesses of the bar mirrors 4D and 4E extending in the Y direction. Although a positioning accuracy in the Z direction on the nanometer order is required as described above, it is technically difficult to process the entire surfaces of bar mirrors with an accuracy on the nanometer order and assemble the thus processed mirrors.

Japanese Patent Laid-Open No. 2001-015422 proposes a technique of improving the positioning accuracy in the Z direction by measuring in advance a Z error attributed to stage driving in the X and Y directions using focus sensors built in the apparatus and determining the target position of the stage by taking account of the measurement result. A Z error attributed to stage driving in the X and Y directions is an error attributed to the processing accuracy of the bar mirrors, and will be referred to as an error of the moving plane of the stage in the following description.

In this technique, the surface of a wafer mounted on the stage or a reflective flat surface in place of a wafer is measured using focus sensors. At this time, the measurement accuracy is influenced by the wafer surface shape under normal conditions. In this technique, however, a plurality of focus sensors are used to eliminate the influence of the wafer surface shape, and measure an error in the moving plane of the stage alone. Referring to FIG. 5, a certain measurement point P on the wafer is measured by a focus sensor 6A, and is then measured by another focus sensor 6B by driving the stage. Regardless of the wafer shape, the focus sensors 6A and 6B are expected to output the same measurement value because they measure the same measurement point P. In fact, different measurement values are obtained by these sensors because an error in the Z direction is included in the measurement values due to stage driving, i.e., the measurement values are influenced by the processing accuracy of the bar mirrors. Hence, the shapes of the bar mirrors can be measured free from the influence of the wafer surface shape by the technique described above.

The thus obtained shape of the Z bar mirror is stored in a memory of a stage control processor (not shown). When the stage is to be driven in an actual exposure sequence, the position of the Z bar mirror in the Z direction can be corrected by calculating a correction value for the Z bar mirror from the target position of the stage. This makes it possible to position the stage at an ideal position at which an error in the shape of the Z bar mirror is corrected.

The measurement of a Z bar mirror (a general term for a Z-X bar mirror and Z-Y bar mirror) using focus sensors is excellent in allowing self calibration solely by the apparatus using, e.g., a wafer instead of using special machines. Not only a Z bar mirror but also an X-Y bar mirror is thought to deform due to a temporal change or a shock upon resetting the apparatus (upon zero seek). Since a bar mirror requires periodical shape measurement to avoid such situations, the merit of requiring no special machines in this technique is very important.

FIG. 4 shows a method other than that which uses a bar mirror as a reference of the Z position and tilt. In this technique, a stage which allows driving in the Z and tilt directions is provided on an X-Y stage which slides the X-Y plane using a stage surface plate surface as a reference, and a linear encoder measures the distance between an X-Y stage (stage surface plate surface reference) and the Z/tilt stage. The former and latter techniques are different in whether the measurement target is a bar mirror or a stage surface plate surface, and this means that the same logic applies to both of these measurement targets. Although a method of measuring the Z position/tilt using a bar mirror will be exemplified hereinafter, quite the same applies to a case in which a stage surface plate surface is measured.

As described above, it is possible to precisely measure the shape of a Z bar mirror using focus sensors and a wafer. As a consequence, by correcting an error component in the Z direction in advance before driving a stage in the X and Y directions, the positioning accuracy in the Z direction improves and the focus accuracy of an exposure apparatus, in turn, improves.

Nevertheless, the bar mirror may gradually or abruptly deform due to various factors. For example, when the bar mirror is fixed with a screw, it tends to gradually restore its original shape with time due to a stress by the screw clamp. This exemplifies a case in which the bar mirror gradually deforms over a relatively long period of time. Note also that since a laser interferometer is a relative position measurement system, the origin position of the stage must be determined upon powering on the apparatus. At this time, the origin position of the stage is often determined by mechanical abutting against it. In this case, a butting force acts on the stage, and this may deform the bar mirror depending on circumstances involved.

The same applies to a case in which a bar mirror is fixed in position using an adhesive, i.e., the bar mirror may deform due to a temporal change in the property of the bonding surface or a mechanical butting force against the stage.

In other words, it is very difficult to mechanically inhibit a change in the shape of the bar mirror with an accuracy on the nanometer order. Even if the shape of the Z bar mirror can be corrected with high accuracy by the method described in Japanese Patent Laid-Open No. 2001-015422, the positioning accuracy in the Z direction often degrades gradually or abruptly.

To overcome this problem, it is necessary to periodically measure the shape of the Z bar mirror by the above-mentioned method. Unfortunately, even in this case, the productivity of the exposure apparatus lowers because of the necessity of measurement while the exposure process is stopped. The rate of deformation of the bar mirror varies depending on the performances of individual exposure apparatuses, so it is hard to know an appropriate measurement timing. If the measurement is performed at too long an interval, the amount of deformation of the bar mirror becomes too large, and this may produce defective products. Conversely, if the measurement is performed too frequently, the operating rate of the exposure apparatus lowers, resulting in degradation in the productivity. Furthermore, in both cases, the above-mentioned method cannot cope with a situation in which the bar mirror has deformed abruptly.

SUMMARY OF THE INVENTION

The present invention provides an exposure apparatus which can measure an error in the optical axis direction of a projection optical system, which is attributed to the driving of a substrate stage, without stopping an exposure process.

According to the present invention, there is provided an exposure apparatus which projects a pattern of a reticle onto a substrate via a projection optical system to scan-expose the substrate, the apparatus comprises: a driving mechanism which scans a substrate stage that holds the substrate in a first direction perpendicular to an optical axis direction of the projection optical system, and moves the substrate stage in steps in a second direction perpendicular to the optical axis direction and the first direction; a first measurement device which measures a position of the substrate stage in the optical axis direction of the projection optical system when the driving mechanism scans the substrate stage in the first direction; a second measurement device which measures surface positions of the substrate in the optical axis direction of the projection optical system at a plurality of measurement points on one straight line extending in the second direction on the substrate; and a controller, wherein the controller controls the second measurement device to measure at least one identical region on the substrate at different measurement points of the plurality of measurement points both before and after the substrate stage moves in steps in the second direction, and calculates a measurement error of the first measurement device attributed to the driving of the substrate stage in the second direction based on the measurement result obtained by the second measurement device.

According to the present invention, it is possible to provide an exposure apparatus which can measure an error in the optical axis direction of a projection optical system, which is attributed to the driving of a substrate stage, without stopping an exposure process. This makes it possible to simultaneously optimize the accuracy and productivity of the exposure apparatus.

Further features of the present invention will become apparent from the following description of exemplary embodiments with reference to the attached drawings.

DESCRIPTION OF THE EMBODIMENTS

Embodiments of a single-stage exposure apparatus and twin-stage exposure apparatus according to the present invention will be individually explained below.

[Twin-Stage Exposure Apparatus]

A twin-stage exposure apparatus includes an exposure region, a measurement region, and a plurality of substrate stages which can move in the exposure region and the measurement region. The exposure apparatus exposes the substrate, which is measured in the measurement region, in the exposure region while positioning the substrate in accordance with the measurement result.

Figure 7:
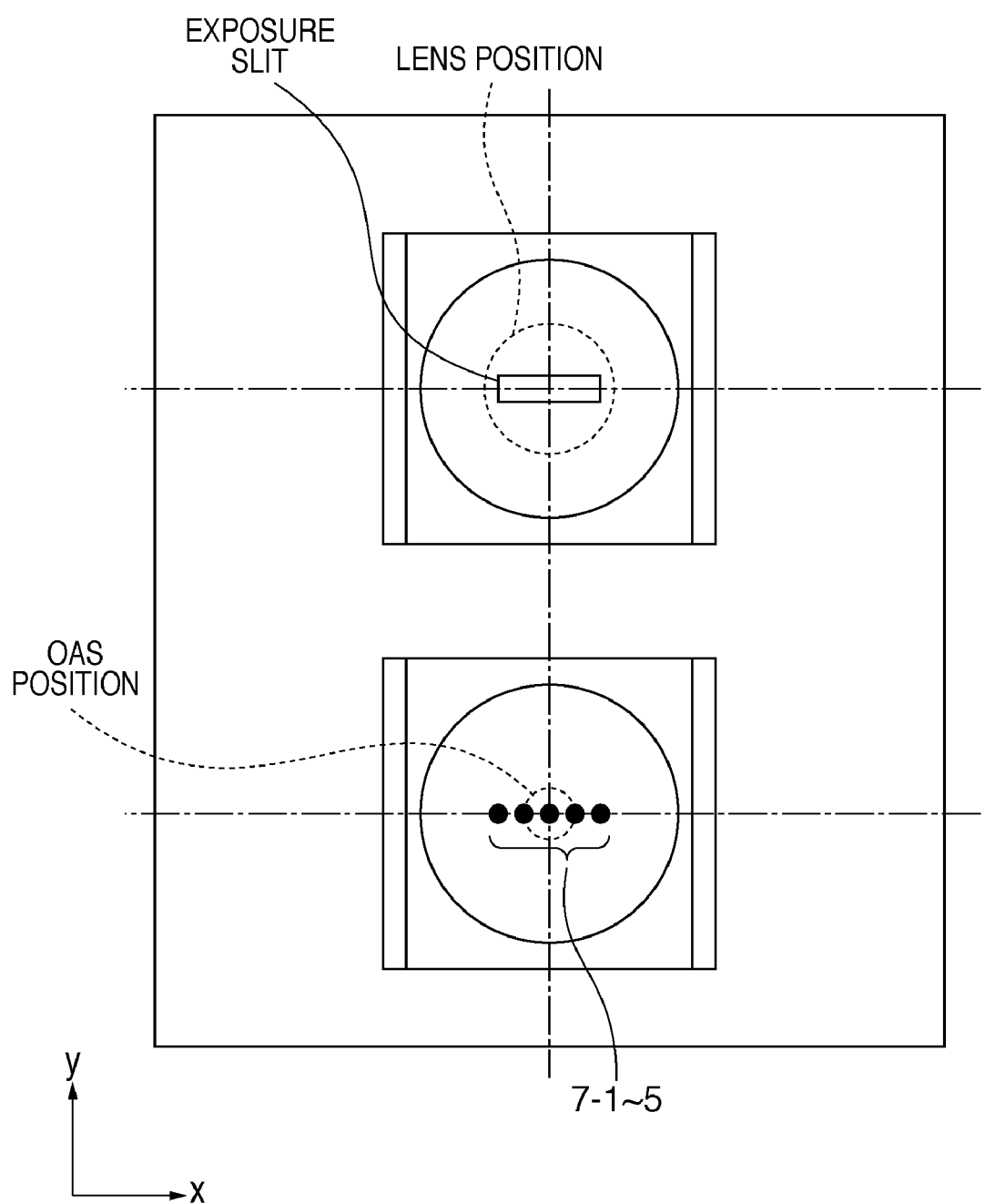
FIG. 7 is a view showing the arrangement of focus sensors and an OAS in the twin-stage configuration.
Figure 8:
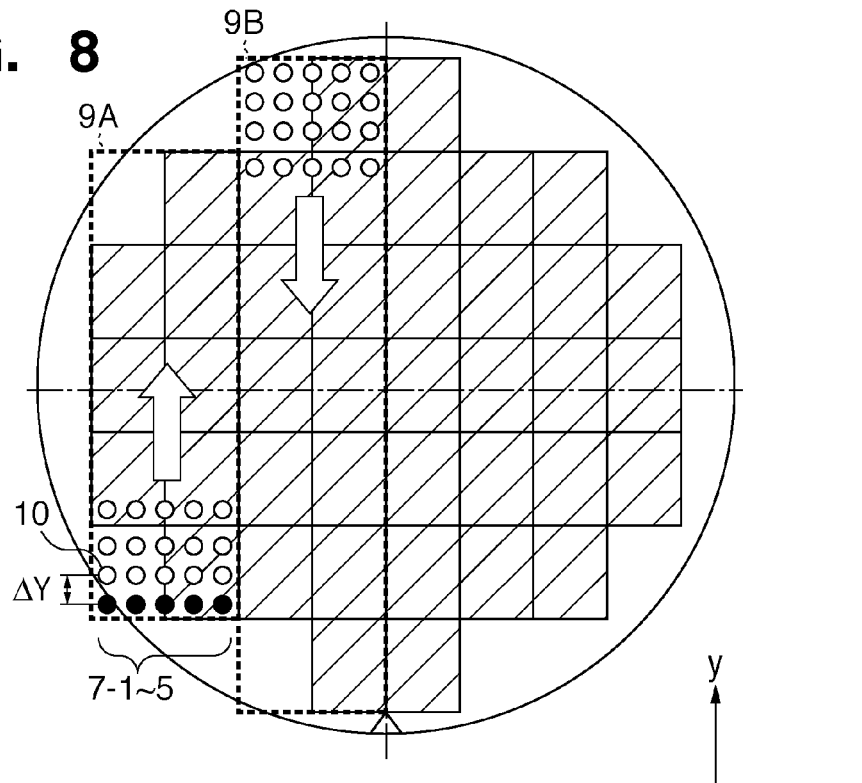
FIG. 8 is a view showing a state in which the substrate entire surface is measured in advance in the twin-stage configuration.

A twin-stage exposure apparatus measures the surface position (level position) of a substrate (wafer) in the optical axis direction of a projection optical system at the OAS position in the measurement region before an exposure process, as shown in FIG. 7. A plurality of measurement points 7-1 to 7-5 of second measurement devices (focus sensors) which measure the substrate level position (focus position) align themselves on one straight line extending in the X direction. The X direction is a second direction perpendicular to the optical axis direction of the projection optical system and a first direction (the Y direction) perpendicular to the optical axis direction. Focus measurement in a region 9A of one column is performed at the plurality of measurement points 7-1 to 7-5 using the focus sensors while scanning a substrate stage which holds a substrate in the Y direction by a driving mechanism (not shown), as shown in FIG. 8. Focus measurement points 10 align themselves in the Y direction typically at a pitch of one to several millimeters. Next, the substrate stage is moved in steps in the X direction by the driving mechanism. After that, focus measurement in a region 9B of an adjacent column is similarly performed while scanning the substrate stage in the X direction by the driving mechanism. By repeating this operation, focus measurement is performed over the entire substrate surface in advance before the start of exposure.

At this time, a focus measurement region of one column is often as large as the width of one shot or the total width of a plurality of shots in order to improve the throughput. In both cases, focus sensors in a number large enough to measure the focus measurement range are arranged.

Figure 10:
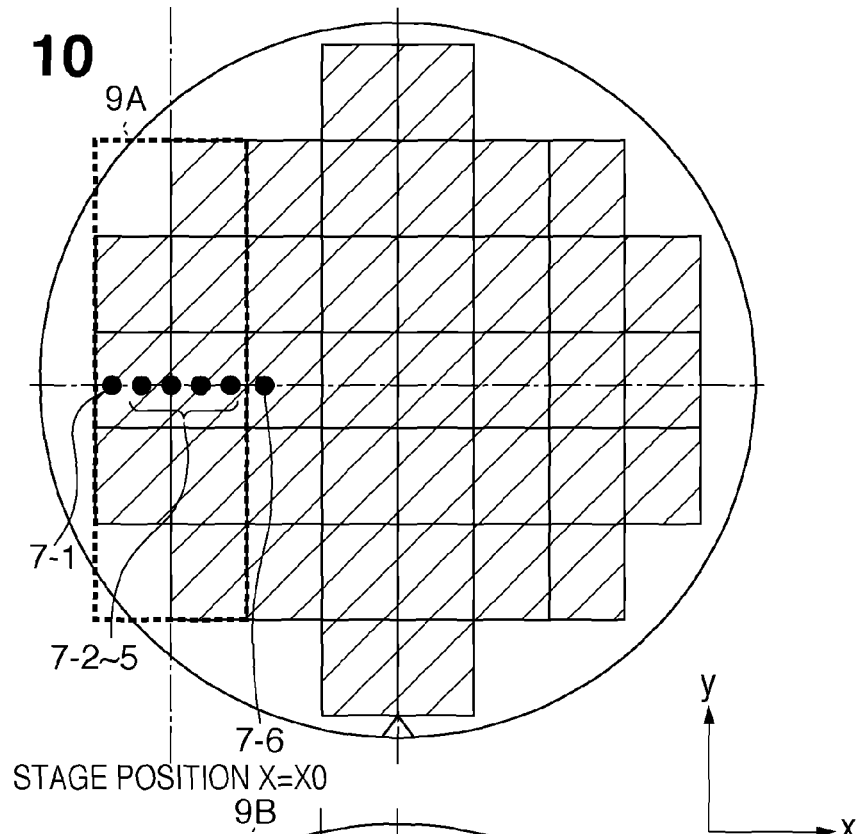
FIG. 10 is a view showing a configuration in which a focus sensor is arranged outside the focus measurement region in the twin-stage configuration.

In the twin-stage configuration as mentioned above, six measurement points 7-1 to 7-6 are set such that one measurement point 7-6 is used to measure the outside of the original measurement region, as shown in FIG. 10, in the embodiment according to the present invention. With this arrangement, a focus measurement region adjacent to one measurement point 7-6 is measured. Although one measurement point is used to measure the outside of the measurement region in this embodiment, two or more measurement points can be used.

Figure 11:
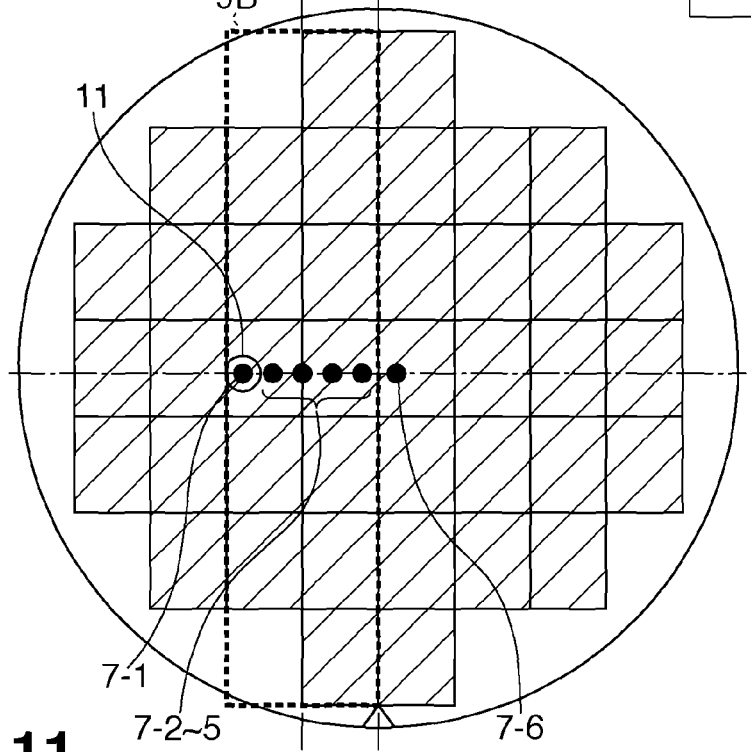
FIG. 11 is a view showing a state in which adjacent focus measurement regions are measured in the twin-stage configuration.

When the region 9A in FIG. 10 is measured, the rightmost measurement point 7-6 is used to measure an adjacent region (the region 9B shown in FIG. 11). Let B(X0) be the measurement value obtained at the rightmost measurement point 7-6 when the region 9A is measured. As described above, since the position in the Y direction is measured at a pitch of one to several millimeters, a plurality of values of B(X0) are also measured in the Y direction. For the sake of convenience, attention is paid only to the measurement value at the substrate center, i.e., the position Y=0 herein. Even when all data on the Y position are averaged, the same result as that obtained using the measurement value at a single Y position can be obtained in theory, as will be described later. The measurement accuracy is expected to improve by the average effect.

When the adjacent region 9B is measured, the leftmost measurement point 7-1 is used to measure the same position (a position 11 in FIG. 11) as that measured using the rightmost measurement point 7-6 when the previous region 9A is measured. Let A(X1) be the measurement value obtained at the measurement point 7-1, and B(X1) be the measurement value obtained at the measurement point 7-6 when the region 9B is measured.

Likewise, the focus sensors sequentially perform focus measurement in adjacent regions at six measurement points 7-1 to 7-6 to complete focus measurement over the entire substrate surface.

A method of calculating the shape of a Z-X bar mirror from the measurement values obtained herein is described in Japanese Patent Laid-Open No. 2001-015422 and the like, and only a simple outline thereof will be described hereinafter.

The measurement results obtained by measuring the same substrate region at the rightmost measurement point 7-6 and leftmost measurement point 7-1 different from each other both before and after the substrate stage moves in steps in the X direction in n regions are as follows. That is, these measurement results include measurement results $B(X0)$ to $B(Xn-1)$ obtained at the rightmost measurement point 7-6 when the substrate stage position X is $X0$ to $Xn-1$, respectively, and measurement results $A(X1)$ to $A(Xn)$ obtained at the leftmost measurement point 7-1 when the substrate stage position X is $X1$ to $Xn$, respectively:

$$\begin{array}{ll} B(X0) & \\ B(X1) & A(X1) \\ B(X2) & A(X2) \\ \vdots & \\ B(Xn-1) & A(Xn-1) \\ & A(Xn) \end{array}$$

Then, the positions X0 to Xn satisfy:

$$X1 = X0 + XF$$
$$X2 = X1 + XF = X0 + 2XF$$
$$\vdots$$
$$Xn = Xn-1 + XF = X0 + nXF$$

where XF is the width, of the focus measurement region, across which the substrate stage moves in steps in order to measure an adjacent region.

The measurement results B(X0) and A(X1) are obtained at the same position 11 on the substrate. In other words, as long as the stage moving plane is ideally flat, the measurement results B(X0) and A(X1) are expected to have the same value. More specifically, the difference between these two measurement results represent the amount of deviation of the stage moving plane from an ideal plane, i.e., the degree of influence of the shape of the Z-X bar mirror. These amounts are defined as Z errors $\Delta Z$ upon driving the substrate stage from X0 to X1, . . . :

$$\Delta Z(X0 \to X1) = A(X1) - B(X0)$$
$$\Delta Z(X1 \to X2) = A(X2) - B(X1)$$
$$\vdots$$
$$\Delta Z(Xn-1 \to Xn) = A(Xn) - B(Xn-1)$$

Each of the above equations represents the error difference upon driving the substrate stage by XF. To represent absolute values Z(X0) to Z(Xn) of the Z-X bar mirror by the Z errors $\Delta Z$, it is only necessary to sum them up as:

$$Z(X0) = 0$$
$$Z(X1) = Z(X0) + \Delta Z(X0 \to X1)$$
$$= 0 + \Delta Z(X0 \to X1)$$
$$Z(X2) = Z(X1) + \Delta Z(X1 \to X2)$$
$$= 0 + \Delta Z(X0 \to X1) + \Delta Z(X1 \to X2)$$
$$\vdots$$
$$Z(Xn) = Z(Xn-1) + \Delta Z(Xn-1 \to Xn)$$
$$= \Delta Z(X0 \to X1) + \ldots + \Delta Z(Xn-1 \to Xn)$$

Note that since there is no reference for the absolute values, the bar mirror error component when the substrate stage is located at the position X0 is tentatively assumed to be zero.

Although X=X0 is used as a criterion for determining the shape of the Z-X bar mirror herein for the sake of calculative convenience, anywhere may be used as the criterion. For example, to use X=Xc as a criterion for determining the shape of the Z-X bar mirror, it is only necessary to subtract the value of Z(Xc) from the absolute values Z(X0) to Z(Xn) in all positions of the Z-X bar mirror as:

$$Z(X0) \to Z(X0) - Z(Xc)$$
$$Z(X1) \to Z(X1) - Z(Xc)$$
$$\vdots$$
$$Z(Xc) \to Z(Xc) - Z(Xc) = 0$$
$$\vdots$$
$$Z(Xn) \to Z(Xn) - Z(Xc)$$

The shape of the Z-X bar mirror obtained herein is merely the amount of change after the previous measurement/correction. In other words, unless the Z-X bar mirror has not changed, the above-mentioned function Z(X) is zero or a value as small as about a measurement error.

A threshold can be set in advance, and the timing at which the Z-X bar mirror is precisely measured can be determined again if the value of Z(X) exceeds the threshold. Japanese Patent Laid-Open No. 2001-015422, for example, describes details of this method.

It is also possible to add the data on Z(X) obtained herein to the correction function of the Z-X bar mirror, as a matter of course. In this case, when there are not one but a plurality of sensors for repeatedly measuring the same point, it is possible to measure not only a Z error but also a tilt error as the stage is driven in the X direction.

As described above, a change in the shape of the Z-X bar mirror can be measured by setting measurement points in a number larger than that of measurement points in the original focus measurement region.

The Z-X bar mirror constitutes a first measurement device which measures the level position of the substrate stage, as the substrate stage is scanned, together with an interferometer. Also, a controller (not shown) calculates a measurement error attributed to the above-mentioned Z-X bar mirror and the interferometer.

A measurement method as described above is viable only when the step size XF in the X direction is equal to the distance between the measurement points 7-1 and 7-6. The step size in the X direction is the same as the size of the focus measurement region in the X direction, i.e., it is an integer multiple of the shot size (the total width of two shots when a plurality of shots are measured simultaneously in FIG. 8). Accordingly, the substrate surface positions measured at two measurement points do not always exactly match each other depending on the shot size.

When the substrate surface is sufficiently flat, and the substrate surface positions measured at two measurement points are adjacent to each other, they are expected to have only a small error although they do not exactly match each other. In other words, the above-mentioned measurement method is satisfactorily useful as long as the interval between measurement points is set sufficiently small, i.e., a large number of measurement points are set in the focus measurement region.

A large number of measurement points cannot always be set considering challenges such as the assurance of cost-effectiveness, as a matter of course. However, the present invention is applicable even in a configuration, in which measurement points are set only in the region where normal focus measurement is performed, as shown in FIG. 8. That is, it is only necessary to set a small focus measurement region only when the Z-X bar mirror is to be measured instead of setting measurement points in a number larger than that of measurement points in the original focus measurement region, as shown in FIG. 10.

Figure 12:
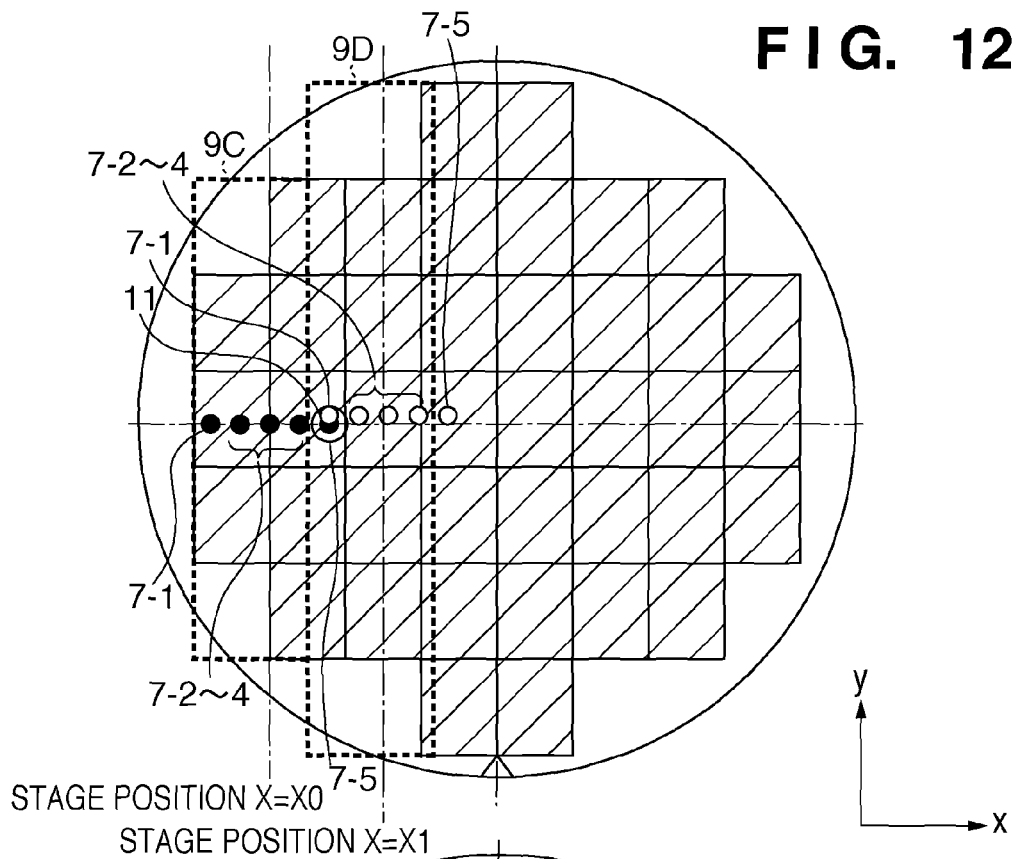
FIG. 12 is a view showing a configuration in which focus sensors are juxtaposed in the X direction in the twin-stage configuration.

FIG. 12 shows this mode. Note that the original focus measurements are simultaneously performed in two columns. Measurement points of focus sensors are set within the total width of two shots. The width of the original focus measurement region is set equal to the total width of two shots. In contrast, in a mode of calculating an error of the stage moving plane using focus sensors, a focus measurement region 9C is set smaller than the total width of two shots. Then, the rightmost measurement point 7-5 of a focus sensor is positioned outside the focus measurement region 9C. Subsequently, the substrate stage is driven in steps in the X direction, and a focus measurement region 9D is measured similarly. At this time, the leftmost measurement point 7-1 is used to measure the substrate surface position 11, which has been previously measured at the rightmost measurement point 7-5. In this manner, the same effect can be obtained by setting the focus measurement region in a mode of calculating a measurement error of the stage moving plane to be smaller than twice the shot width. Likewise, when focus measurement is performed for each column of shots, the focus measurement region need only be set smaller than the shot width.

In that case, because the focus measurement region is reduced in the X direction, a larger number of regions need to be measured in order to measure the entire substrate surface. In other words, the measurement time is prolonged in that case.

Furthermore, when the exposed substrate undergoes multiple exposure (when an underlying pattern is present), it is necessary to eliminate any error components of the focus sensors attributed to the underlying pattern. In general, it is necessary to subtract a common component of all shots, i.e., the average value of all shots on the entire substrate surface from the measurement value. If the step size XF in the X direction is an integer multiple of the shot size, the focus sensor measures the same position in the shot at each measurement point, and it is easy to eliminate the shot common component over the entire substrate by the previously described method. In contrast, if the focus measurement region 9C is set smaller than the total width of two shots, the substrate surface position in the shot at each measurement point differs for each focus measurement region.

To cope with this situation, a condition such as that this error elimination operation is performed only when a substrate having no underlying pattern is exposed may be set. If no underlying pattern is present, no error attributed to the pattern occurs, so the above-mentioned problem is not posed. Moreover, because a substrate having no underlying pattern does not require alignment measurement for precisely measuring the shot position of the underlying pattern, the measurement station has a time margin. Hence, a decrease in the throughput can be suppressed by measuring the Z bar mirror for only a substrate having no underlying pattern.

Because the bar mirror normally deforms moderately, an error in the Z direction need not always be measured every time and need only be measured at a certain time interval. Accordingly, an error in the Z direction need only be measured for only a substrate having no underlying pattern. For example, the measurement can be performed every time a predetermined number of substrates are processed. The measurement may be performed every time a predetermined time elapses instead of every time a predetermined number of substrates are processed. The bar mirror is likely to unexpectedly deform immediately after the exposure apparatus is powered on, so an error in the Z direction is desirably measured at the time of power-on.

When the focus measurement region on a substrate having an underlying pattern is set small when the Z-X bar mirror is to be measured, a shot common component can be eliminated for each focus measurement region instead of eliminating a shot common component over the entire substrate surface. That is, a shot common component is eliminated in the focus measurement region 9C in FIG. 12. The focus sensor generally measures the same substrate surface position at each measurement point for shots arrayed in the Y direction, a component common to shots need only be eliminated every time this focus measurement process is performed, i.e., for each set of shots arrayed in the Y direction. Since the region 9C includes two columns of shots, the same process is performed twice. Likewise, a component common to shots arrayed in the Y direction is eliminated in the region 9D. Since this elimination process must be performed even for a partially measured shot, it is performed three times in the region 9D. By repeating this process over the entire substrate surface, an error attributed to the underlying pattern can be eliminated. As a consequence, even when measurement points in a number larger than that of measurement points in the original focus measurement region are set, or the X step size XF is not an integer multiple of the shot width in the X direction, an error of the Z bar mirror can be calculated while eliminating an error attributed to the underlying pattern.

However, it is preferable to calculate a component common to the entire substrate surface, as shown in FIG. 10, in order to improve the accuracy.

A method of measuring an error of the Z-X bar mirror has been described above. An error of the Z-X bar mirror is a Z error upon driving the substrate stage in the X direction. Although attention is paid to Y=0 alone in each focus measurement region herein, the difference between the measurement results B(X0) and A(X1) is the same at all Y positions. For this reason, even when the measurement results obtained at all Y positions are averaged, it is possible to similarly measure the shape of the Z-X bar mirror and reduce measurement errors by the average effect.

Figure 13:
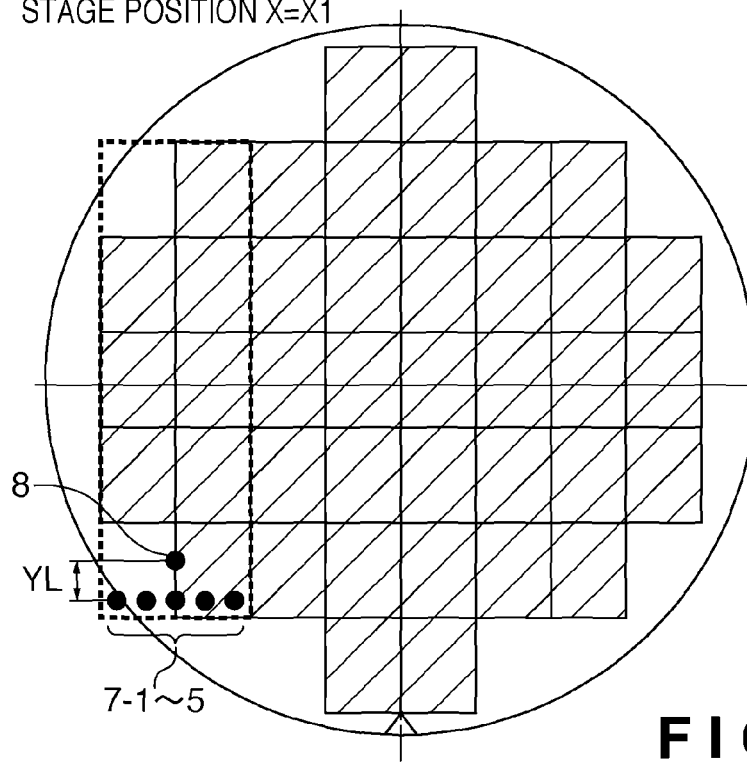
FIG. 13 is a view showing a state in which adjacent focus measurement regions are measured in the single-stage configuration.

A Z-X bar mirror has been exemplified above. However, an error of a Z-Y bar mirror can be measured by setting a measurement point 8 obtained by shifting a measurement point 7 in the Y direction such that they match each other upon driving the substrate stage in the Y direction, as shown in FIG. 13.

Since the measurement pitch in the Y direction can be set freely, it is easy to set measurement points shifted in the Y direction such that they always match each other. If a sensor position obtained by shifting a certain sensor position in the Y direction is spaced apart from it by YL, the pitch of focus measurement over the entire substrate surface need only be equal to YL or a fraction of YL. This makes it possible to match the substrate positions measured at a plurality of measurement points shifted in the Y direction with the corresponding substrate surface positions measured at different measurement points. The subsequent processes for calculating the shape of the Z-Y bar mirror can be performed by the same principle as in the X direction, and a description thereof will not be given.

[Single-Stage Exposure Apparatus]

A method of performing focus measurement immediately before exposure, which is used in a single-stage exposure apparatus, will be explained next.

The method of performing focus measurement immediately before exposure differs between the scheme of exposure while the wafer stands still and the scanning exposure scheme. The current mainstream exposure scheme will be described herein.

Figure 1:
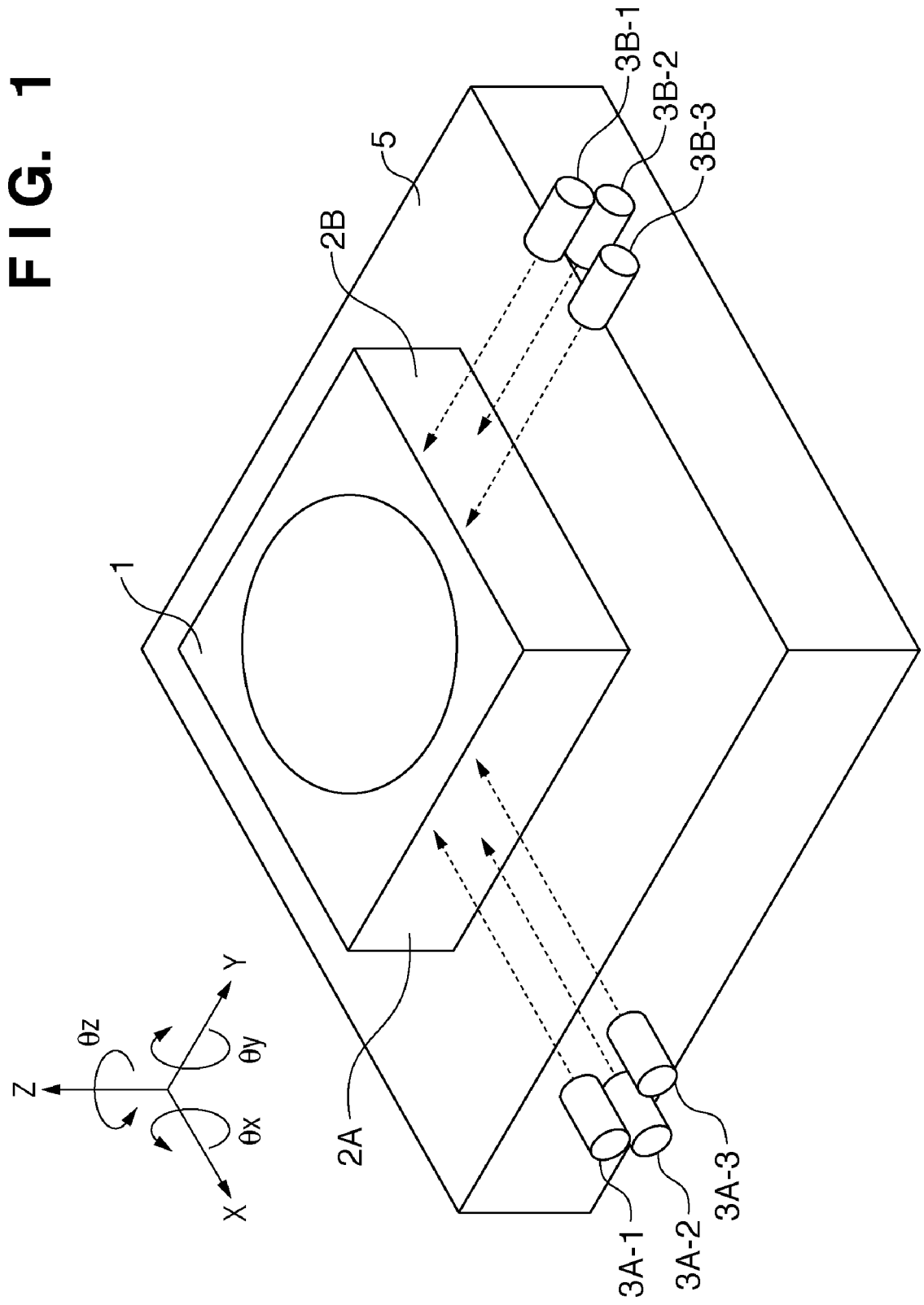
FIG. 1 is a view showing a substrate stage configuration which allows measurement associated with the tilt of a substrate stage.
Figure 2:
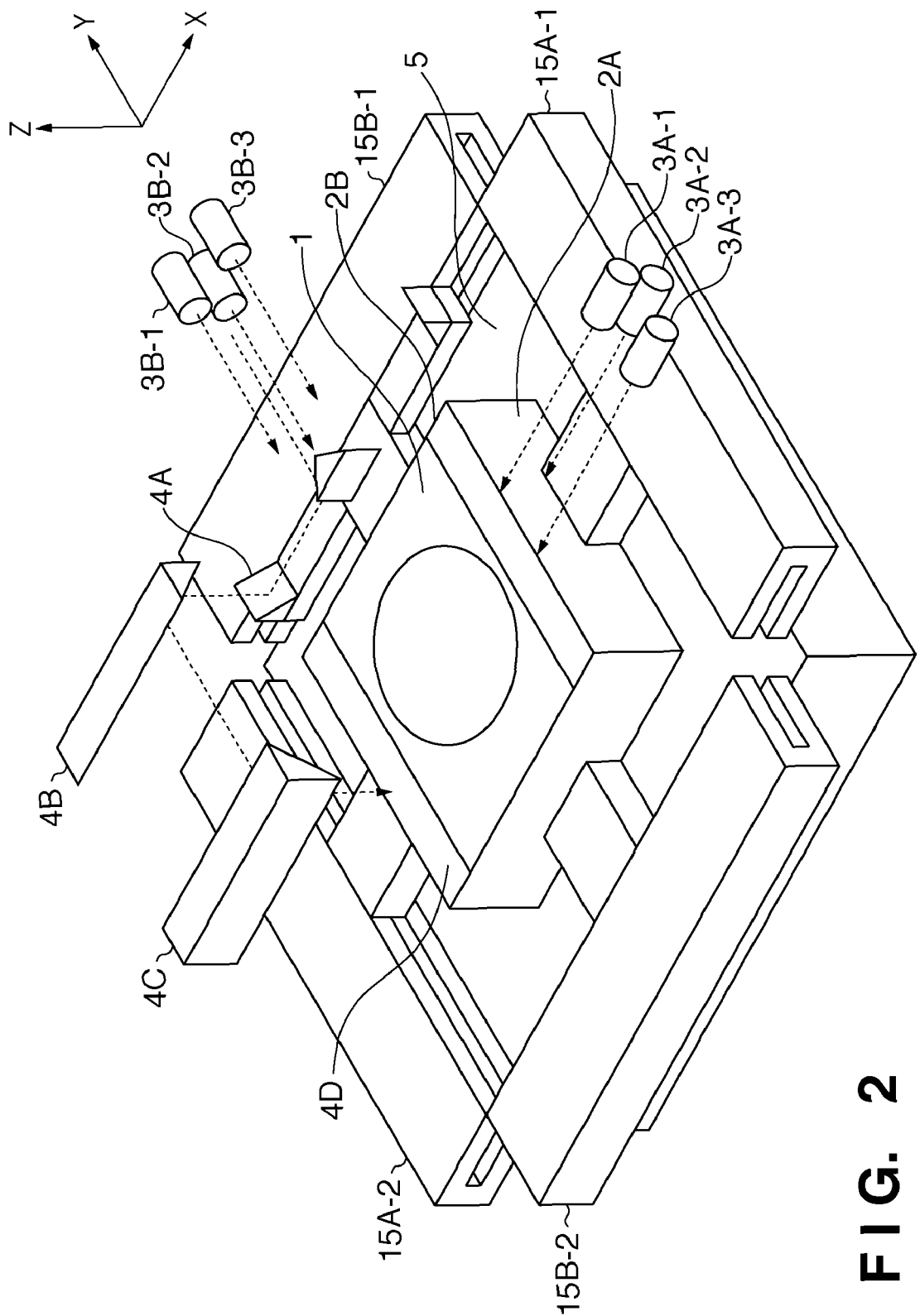
FIG. 2 is a view illustrating one example of the configuration of a Z laser interferometer.
Figure 3:
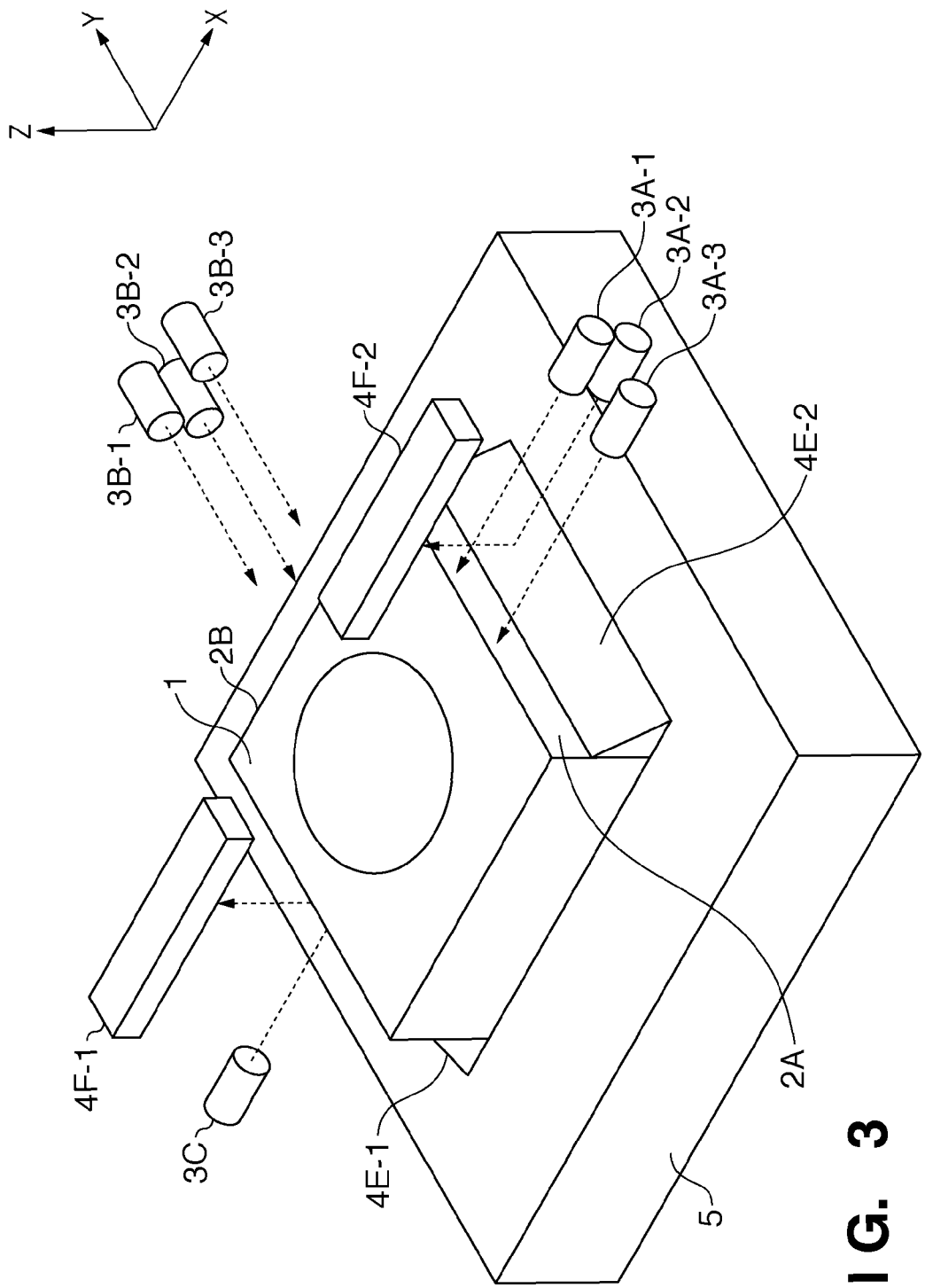
FIG. 3 is a view illustrating another example of the configuration of a Z laser interferometer.
Figure 4:
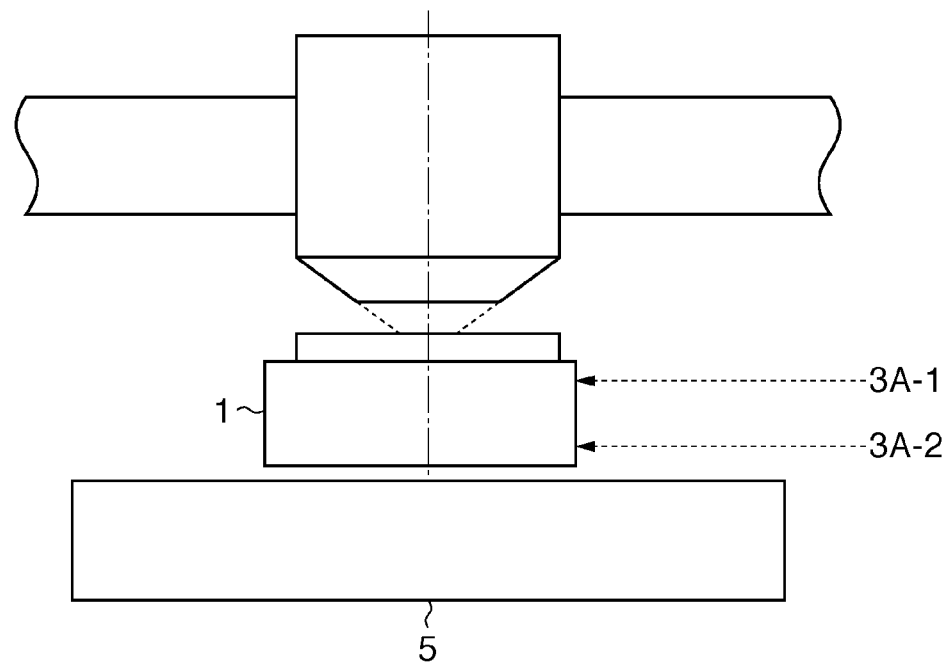
FIG. 4 is a view illustrating one example of a configuration in which a reference stage is mounted on a stage surface plate.
Figure 5:
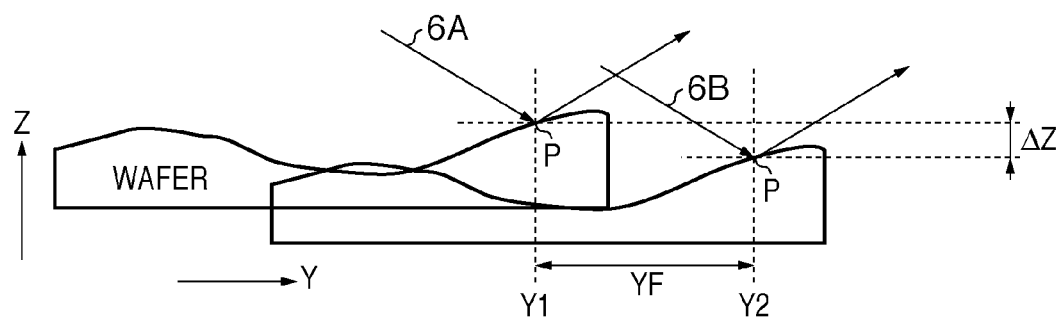
FIG. 5 is a view showing a method of measuring a Z error, which depends on the stage position, by a plurality of focus sensors.
Figure 6:
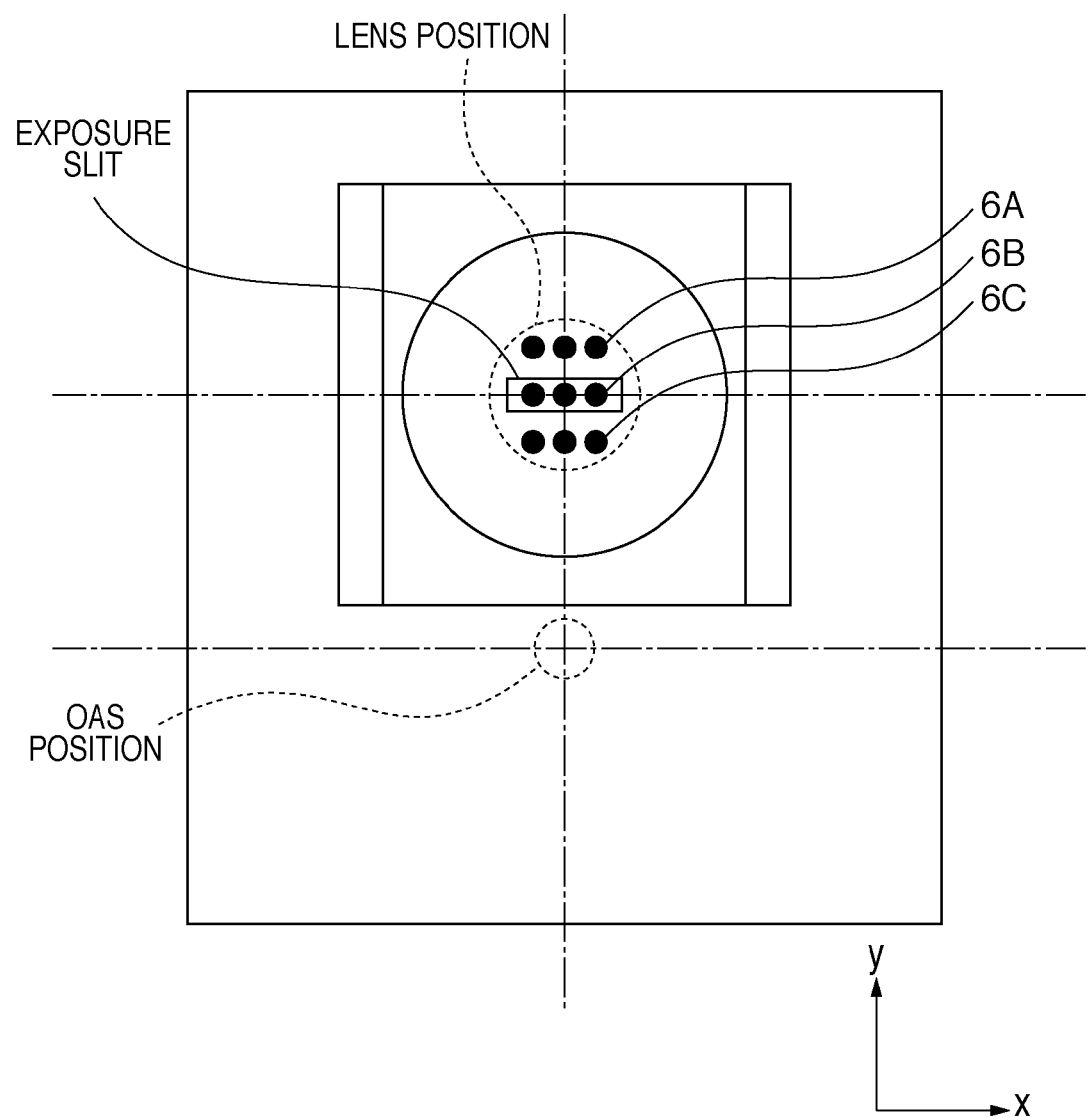
FIG. 6 is a view showing the arrangement of focus sensors and an OAS in the single-stage configuration.

FIG. 6 shows the stage configuration of the scanning exposure scheme and the arrangement of focus sensors. Exposure light forms a rectangular exposure shape upon passing through an exposure slit. The substrate stage is driven to move the rectangular exposure range on the substrate, and one-shot exposure is performed. Hence, the feature of the scanning exposure scheme is that the one-shot exposure region is relatively large.

The longitudinal direction of the exposure slit is defined as a first direction (the X direction), and its widthwise direction is defined as a second direction (the Y direction). The substrate stage is scanned in the Y direction with exposure, and moves in steps in the X direction in order to expose a shot adjacent to the current shot.

Focus sensors 6A and 6C are typically arranged several millimeters in front of the exposure slit, and focus measurement is performed before the exposure slit enters the exposure region. Exposure can be performed with a best focus by driving the substrate stage in the Z direction until the exposure slit enters the exposure region. Setting a plurality of measurement points of focus sensors in the X and Y directions allows measurement of the tilt in the exposure slit as well. For the sake of convenience, FIG. 6 illustrates an example in which focus sensors are juxtaposed in the X direction alone.

A concrete scheme in such a stage configuration will be described below.

Figure 9:
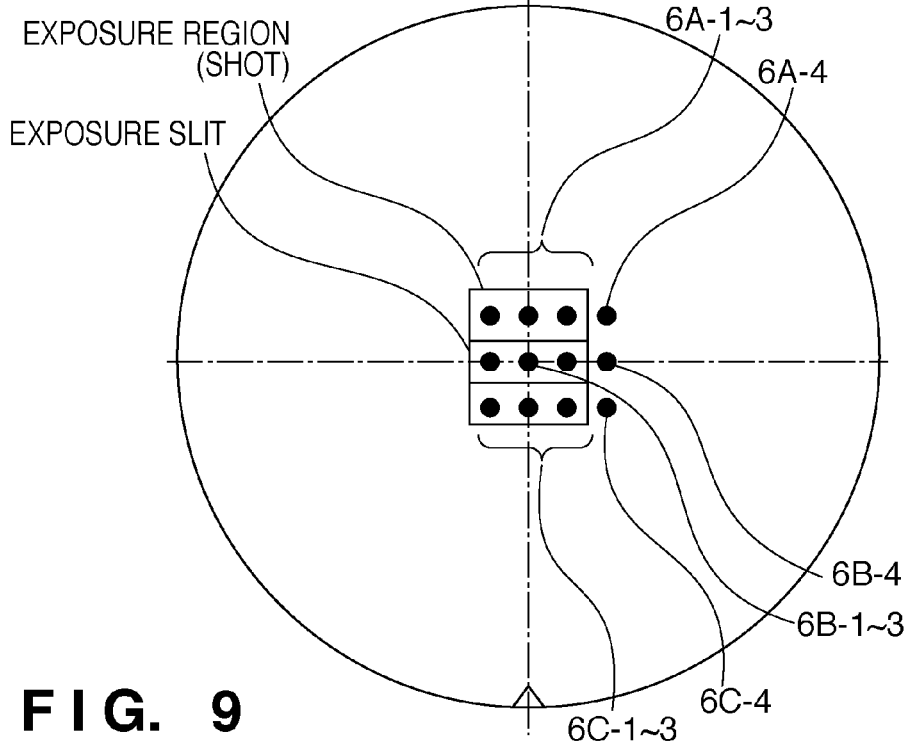
FIG. 9 is a view showing a configuration in which a focus sensor is arranged outside the focus measurement region in the single-stage configuration.

The conventional focus sensor measures the tilt and the position, in the Z direction, of the substrate stage in a region smaller than a maximum exposure width (a maximum width in the X direction). However, in this embodiment, a measurement point is also set outside a maximum exposure region, as shown in FIG. 9.

A focus measurement method in this stage configuration will be explained with reference to FIG. 14. A first exposure region 12-1 is exposed while being scanned by the substrate stage. In this case, the substrate surface levels are measured at measurement points 6A-1 to 6A-3 before the exposure slit reaches the exposure region. As the exposure slit has reached the exposure region, the driving of the substrate stage in the Z and tilt directions is complete. At this time, to confirm whether the stage has been adjusted, measurements are performed at measurement points 6B-1 to 6B-3 using focus sensors which measure the slit positions. The operations described so far are the same as in a normal exposure sequence. However, in this embodiment, an exposure region 12-2 which is adjacent to and falls outside the first exposure region 12-1 is measured at a rightmost measurement point 6B-4 specially set for the operation involved. After the exposure of the first exposure region 12-1 is completed, the exposure region 12-2 adjacent to it is exposed by moving the substrate stage in steps in the X direction. In this case, a substrate surface position 13 which has been measured at the rightmost measurement point 6B-4 in the exposure of the first exposure region 12-1 is measured again at the leftmost measurement point 6B-1.

The subsequent focus measurement processes are the same as in the twin-stage configuration. That is, as the same position on the substrate is measured at different measurement points, the same measurement value is expected to be obtained at these measurement points. In fact, different measurement values are obtained at these measurement points because an error in the Z direction is generated in the measurement values due to the driving of the substrate stage in the X direction. The cause for this error is a temporal change in the shape of the Z bar mirror, and this means that the Z bar mirror requires adjustment. Hence, the shape of the bar mirror in the substrate stage driving range can be calculated by performing this method over the entire substrate surface.

In the twin-stage configuration, the tilt and the position, in the Z direction, of the substrate are measured in adjacent regions in a constant state. In contrast, in the single-stage configuration, i.e., in real-time focusing, the substrate stage is driven in the Z and tilt directions for each exposure region. This makes it necessary to take account of not only the measurement values obtained by the focus sensors but also the driving amount of the substrate stage. For the sake of simplicity, a case in which the substrate stage is driven in the Z direction alone will be considered. As in the twin-stage configuration, a measurement result B(X) obtained at the measurement point 6B-4, a measurement result A(X) obtained at the measurement point 6B-1, and a Z driving amount S(X) of the substrate stage at the stage X position include:

$$
\begin{array}{lll}
B(X0) & & S(X0) \\
B(X1) & A(X1) & S(X1) \\
B(X2) & A(X2) & S(X2) \\
\vdots
\end{array}
$$

-continued
$$
\begin{array}{lll}
B(Xn-1) & A(Xn-1) & S(Xn-1) \\
& A(Xn) & S(Xn)
\end{array}
$$

By taking account of the driving amount of the substrate stage, Z errors ΔZ are given by:

$$\Delta Z(X0 \to X1) = \{A(X1) - S(X1)\} - \{B(X0) - S(X0)\}$$
$$\Delta Z(X1 \to X2) = \{A(X2) - S(X2)\} - \{B(X1) - S(X1)\}$$
$$\vdots$$
$$\Delta Z(Xn-1 \to Xn) = \{A(Xn) - S(Xn)\} - \{B(Xn-1) - S(Xn-1)\}$$

In the single-stage configuration, the shape of the Z bar mirror can be calculated over the entire substrate surface in exactly the same way as in the twin-stage configuration.

When the substrate stage is driven in the tilt direction, the shape of the Z bar mirror can be calculated in the above-mentioned way by representing the Z amount at the focus measurement position using the Z errors based on the distance from the rotation center and the tilt amount.

Letting Zs(X) be the driving amount of the stage in the Z direction at the stage position X, Tilt–X(X) be the tilt of the stage in the X direction, Xrot(X) be the distance from the rotation center to the focus measurement position, Tilt–Y(X) be the tilt of the stage in the Y direction, and Yrot(X) be the distance from the rotation center to the focus measurement position, they satisfy:

$$S(X)=Zs(X)+\text{Tilt–}X(X)\cdot X\text{rot}(X)+\text{Tilt–}Y(X)\cdot Y\text{rot}(X)$$

The above equation need only be applied to each X position (X0, X1, . . . , Xn).

Although the distance from the focus measurement position to the rotation center is variable at each X position, it often has a fixed value depending on the stage control scheme. Also, whether the terms of the above equation have a positive or negative sign, i.e., whether they are summed up or subtracted from each another is determined depending on the positive direction (plus direction) of the rotation angle. A detailed description of this mechanism will not be given herein.

Although a measurement process for the position Y=0 alone has been described above for the sake of convenience, a plurality of measurement positions typically align themselves in the Y direction at an interval of several millimeters in one exposure region. The measurement results obtained at all these measurement positions may be averaged. Since exposure regions also align themselves in the Y direction, further averaging the measurement results obtained in these regions makes it possible to reduce the influence of measurement errors.

Also, although the above equation has been described on the premise that the measurement points 6B-1 and 6B-4 of focus sensors set at the substrate center are matched, the same effect can be obtained even by matching the measurement points 6A-1 and 6A-4 or 6C-1 and 6C-4 of look-ahead sensors. Hence, the measurement result obtained at one of combinations of measurement points may be used, or the average of the measurement results obtained at all combinations of measurement points may be used.

Figure 14:
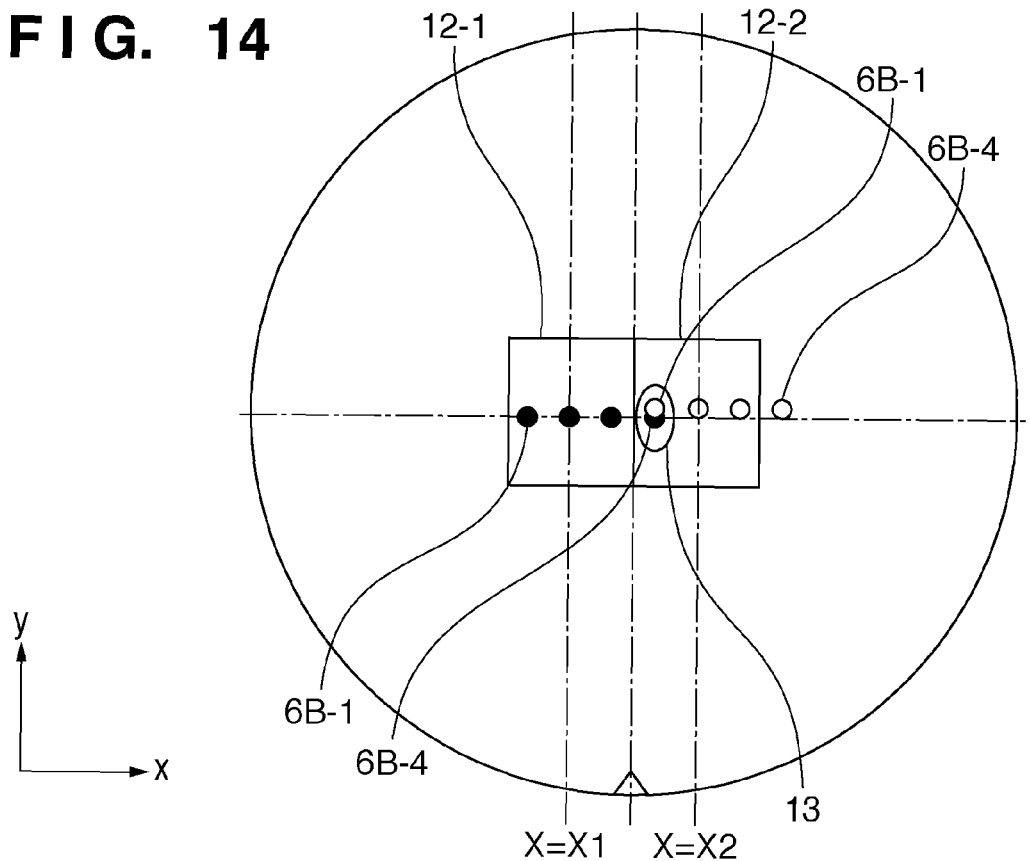
FIG. 14 is a view for explaining a single-stage exposure apparatus.

FIG. 14 illustrates an example in which the number of measurement points of focus sensors set on one side is larger than those on the other side by one. When measurement points set on both sides of the exposure region are increased by one or a plural number, not only an error in the Z direction due to X driving but also a tilt error can be measured. However, as the number of measurement points to be set increases, the cost involved naturally increases.

When the above equation holds, the substrate surface positions measured at the measurement points 6B-1 and 6B-4 perfectly match each other, i.e., the interval between the measurement points 6B-1 and 6B-4 is the same as the width of the exposure region (shot) (the step-driving amount in the X direction). However, in practice, the width of the exposure region in normal exposure varies depending on the pattern to be transferred by exposure. Considering this fact, the same process may be performed even when very close positions on the substrate are measured at the measurement points 6B-1 and 6B-4 of focus sensors even if exactly the same position on the substrate cannot be measured. Measurement is satisfactorily possible especially when the substrate has no exposed underlying pattern and therefore has sufficiently high flatness.

FIG. 14 is a view showing a state in which three measurement points 6B-1 to 6B-3 are set within the exposure region, and one measurement point 6B-4 is set outside the exposure region. By setting a larger number of measurement points with narrower spacings between them, the same position (or very close positions) on the substrate can be measured at two or more measurement points at every shot width.

As described previously, the shot width in a normal exposure sequence varies depending on the pattern to be transferred, and, naturally, exposure is not always be performed at a maximum exposure width. When the width (in the X direction) of the exposure region is smaller than that of the focus sensor, an error component in the Z direction can be calculated in real-time focusing in the single-stage configuration as well. For example, an error component in the Z direction can be calculated when the exposure apparatus is powered on, when the origin position of the substrate stage is determined, or for the first substrate in a lot to undergo an exposure process. In this case, there is no need to set measurement points in excess of the range of a maximum exposure width. That is, the focus measurement method according to the present invention is cost-effective because it requires no measurement point as exemplified by the measurement point 6B-4 shown in FIG. 14. This focus measurement method is possible for almost all exposure apparatuses. However, the focus measurement method according to the present invention is not applicable to exposure of all types of shots, and is strictly limited to exposure of a shot with a smaller width than the focus sensor. The subsequent focus measurement processes are the same as above, and a description thereof will not be given.

A Z bar mirror in the X direction can be adjusted in the above-mentioned way. Since look-ahead sensors are generally juxtaposed in the Y direction, there is no need to newly set measurement points for focus measurement in the Y direction. An error component in the Z direction can be calculated by measuring the same position at different measurement points during a normal exposure sequence. That is, a method as described above is usable as long as the positions on the substrate, which are measured by the focus sensors at the measurement points 6A-1 to 6A-3 in advance, are scanned in the Y direction and the scanned positions are measured by the focus sensors at the measurement points 6B-1 to 6B-3.

The same as in the X direction of a scanning exposure apparatus applies to a case in which exposure is performed while the wafer stands still. That is, it is only necessary to set measurement points in a range wider in the X and Y directions than a maximum exposure width or expose a region smaller in the X or Y direction than the range in which measurement points are set.

Processes after the shape of the Z bar mirror is calculated in the above-mentioned way are exactly the same as in the twin-stage configuration. After the value of Z(X) exceeds a threshold set in advance, the Z-X bar mirror may be measured again. The data on Z(X) obtained herein may be added to the correction function of the Z-X bar mirror.

The measurement timing may be before each shot, and the measurement method proposed in the present invention may be used for only a substrate having no underlying pattern. The measurement method according to the present invention may be performed every time a preset number of substrates are processed or every time a preset time elapses. Alternatively, the measurement method according to the present invention may be always performed immediately after power-on.

[Explanation of Exposure Apparatus]

Figure 15:
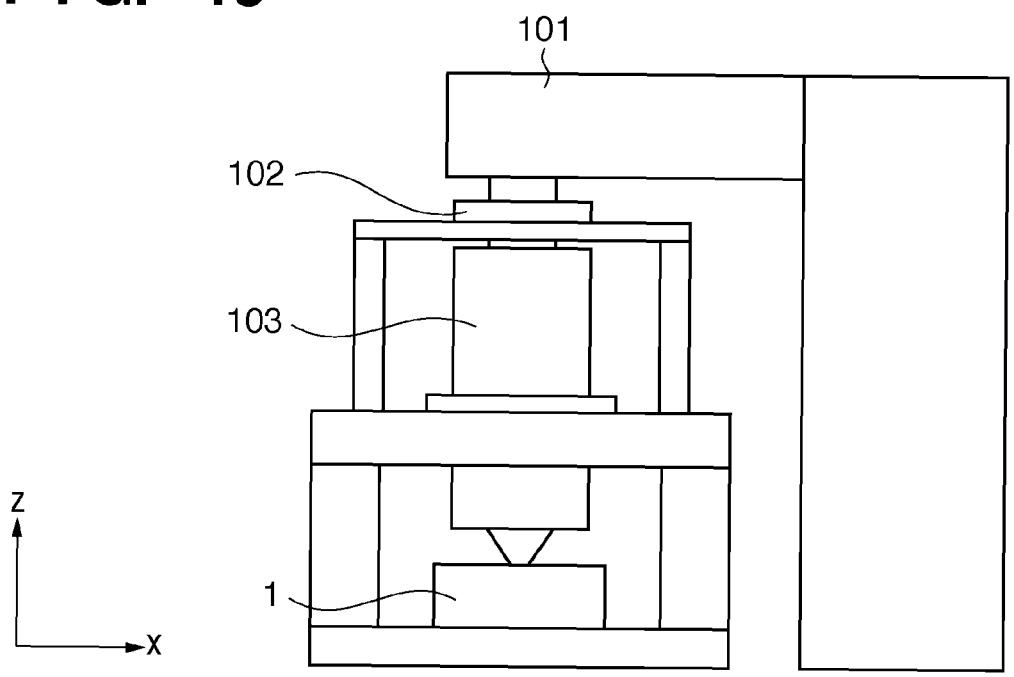
FIG. 15 is a view illustrating one example of an exposure apparatus.

An exemplary single-stage exposure apparatus to which the present invention is applied will be explained below. The exposure apparatus includes an illumination device 101, a reticle stage 102 which mounts a reticle, a projection optical system 103, and a substrate stage 1 which holds a substrate, as shown in FIG. 15. The substrate stage 1 moves in the Y direction while being manipulated by a driving mechanism (not shown), and moves in steps in the X direction, as described above. The exposure apparatus projects a circuit pattern formed on a reticle onto a substrate to scan-expose the substrate.

The illumination device 101 illuminates a reticle on which a circuit pattern is formed, and includes a light source unit and illumination optical system. The light source unit uses, for example, a laser as a light source. The laser can be, e.g., an ArF excimer laser having a wavelength of about 193 nm, a KrF excimer laser having a wavelength of about 248 nm, or an $F_2$ excimer laser having a wavelength of about 153 nm. However, the type of laser is not limited to an excimer laser and may be, for example, a YAG laser, and the number of lasers is not limited, either. When a laser is used as a light source, an optical system for shaping a collimated light beam from the laser light source into a desired beam shape, and an optical system for converting a coherent laser beam into an incoherent laser beam can be used. Also, the light source which can be used for the light source unit is not limited to a laser, and one or a plurality of mercury lamps or xenon lamps can be used. The illumination optical system illuminates a mask and includes, e.g., a lens, mirror, light integrator, and stop.

The projection optical system 103 can be, e.g., an optical system including a plurality of lens elements alone, an optical system including a plurality of lens elements and at least one concave mirror, an optical system including a plurality of lens elements and at least one diffractive optical element such as a kinoform, or an optical system including mirrors alone.

The reticle stage 102 and the substrate stage 1 can move by, for example, a linear motor. The stages 102 and 1 move synchronously. Actuators (driving mechanisms; not shown) are provided to the substrate stage 1 and the reticle stage 102 in order to align the reticle pattern onto the substrate.

An exemplary method of manufacturing devices such as a semiconductor integrated circuit device and a liquid crystal display device using the above-mentioned exposure apparatus will be explained next.

The devices are manufactured by an exposure step of exposing a substrate using the above-mentioned exposure apparatus, a development step of developing the substrate exposed in the exposure step, and other known steps of processing the substrate developed in the development step. The other known steps include, e.g., etching, resist removal, dicing, bonding, and packaging steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-150836, filed Jun. 9, 2008, which is hereby incorporated by reference herein in its entirety.

What is claimed is:

1. An exposure apparatus which projects a pattern of a reticle onto a substrate via a projection optical system to scan-expose the substrate, the apparatus comprising:
    a driving mechanism which scans a substrate stage that holds the substrate in a first direction perpendicular to an optical axis direction of the projection optical system, and moves the substrate stage in steps in a second direction perpendicular to the optical axis direction and the first direction;
    a first measurement device which measures a position of the substrate stage in the optical axis direction of the projection optical system when said driving mechanism scans the substrate stage in the first direction;
    a second measurement device which measures surface positions of the substrate in the optical axis direction of the projection optical system at a plurality of measurement points on one straight line extending in the second direction on the substrate; and
    a controller,
    wherein said controller controls said second measurement device to measure at least one identical region on the substrate at different measurement points of the plurality of measurement points both before and after the substrate stage moves in steps in the second direction, and calculates a measurement error of said first measurement device attributed to the driving of the substrate stage in the second direction based on the measurement result obtained by said second measurement device.

2. The apparatus according to claim 1, wherein said controller reduces a width, across which the substrate stage moves in steps in the second direction, so that said second measurement device can measure at least one identical region on the substrate at different measurement points, in a mode of calculating a measurement error of said first measurement device.

3. The apparatus according to claim 1, wherein said controller corrects the measurement result obtained by said first measurement device using the calculated measurement error of said first measurement device.

4. The apparatus according to claim 1, wherein
    said first measurement device includes a bar mirror and an interferometer, and
    said controller determines a timing at which said bar mirror is measured based on the calculated measurement error of said first measurement device.

5. The apparatus according to claim 1, wherein said second measurement device performs the measurements at different measurement points in at least one identical region on the substrate when the exposure apparatus is powered on, when an origin position of the substrate stage is determined, or when a first substrate in a lot to undergo an exposure process is loaded onto the substrate stage.

6. The apparatus according to claim 1, wherein said second measurement device performs the measurements at different measurement points in at least one identical region on the substrate every time a predetermined number of substrates are processed or every time a predetermined time elapses.

7. The apparatus according to claim 1, wherein said second measurement device performs the measurements at different measurement points in at least one identical region on the substrate for a substrate having no underlying pattern.

8. The apparatus according to claim 1, wherein
    the exposure apparatus includes an exposure region in which the substrate is exposed via the projection optical system, a measurement region in which the substrate is measured, and a plurality of substrate stages that can move between the exposure region and the measurement region, and exposes the substrate, measured in the measurement region, in the exposure region while positioning the substrate in accordance with the measurement result obtained in the measurement region, and
    said first measurement device and said second measurement device are positioned in the measurement region.

9. The apparatus according to claim 1, wherein the exposure apparatus exposes the substrate while positioning the substrate based on the measurement result obtained by said first measurement device.

10. A method of manufacturing a device, the method comprising the steps of:
    exposing a substrate using an exposure apparatus according to claim 1; and
    developing the substrate exposed; and
    processing the developed substrate to manufacture the device.

* * * * *